United States Patent
Blon

(10) Patent No.: US 7,423,482 B2
(45) Date of Patent: Sep. 9, 2008

(54) CIRCUIT CONFIGURATION HAVING A FEEDBACK OPERATIONAL AMPLIFIER

(75) Inventor: Thomas Blon, Jengen (DE)

(73) Assignee: National Semiconductor Germany AG, Unterhaching (DE)

( * ) Notice: Subject to any disclaimer, the term of this patent is extended or adjusted under 35 U.S.C. 154(b) by 76 days.

(21) Appl. No.: 11/524,004

(22) Filed: Sep. 20, 2006

(65) Prior Publication Data

US 2007/0075768 A1    Apr. 5, 2007

(30) Foreign Application Priority Data

Sep. 30, 2005    (DE) .................. 10 2005 047 172

(51) Int. Cl.
*H03F 1/36*    (2006.01)
(52) U.S. Cl. .......................... 330/86; 330/260
(58) Field of Classification Search ............ 330/51, 330/86, 110, 260, 290
See application file for complete search history.

(56) References Cited

U.S. PATENT DOCUMENTS

| | | | |
|---|---|---|---|
| 3,947,806 A * | 3/1976 | Corkhill et al. ............ 367/67 |
| 4,079,334 A | 3/1978 | Hamilton |
| 4,399,416 A | 8/1983 | Gillespie |
| 6,933,786 B1 * | 8/2005 | Mohandas et al. .......... 330/308 |
| 7,205,845 B2 * | 4/2007 | Harms et al. ............... 330/308 |

OTHER PUBLICATIONS

Paul Horowitz et al., "Feedback and Operational Amplifiers, Chapter 4", The Art of Electronics, Second Edition, Cambridge University Press, 1980, 1989, pp. 175-195.
Ulrich Tietze et al., "6 Der Operationsverstärker", Advanced Electronic Circuits, Springer-Verlag Berlin Heidelberg, 1969, 1971, 1974, 1976, 1978, and 1980, pp. 93-108; English Summary included.

* cited by examiner

*Primary Examiner*—Henry K Choe
(74) *Attorney, Agent, or Firm*—Pearne & Gordon LLP

(57) ABSTRACT

The present invention relates to a circuit configuration (10) having a feedback operational amplifier (AMP) for amplifying an input signal (Vin) input into the circuit arrangement (10) and outputting the amplified input signal as an output signal (Vout). The circuit amplification (Vout/Vin) may be changed by selectively connecting or disconnecting impedances (R1, . . . RN). Integration elements (INT1. . . INT N) connected upstream from each of the control inputs of transistors (S1, . . . SN) used for this purpose ensure a certain temporal smoothing of the curve of the circuit amplification (Vout/Vin) when connecting or disconnecting an impedance (R1, . . . RN). The integration element particularly ensures that even in the event of a sudden change of the affected activation signal (VD1, . . . VDN), the affected impedance (R1, . . . RN) is not also suddenly disconnected or connected.

11 Claims, 3 Drawing Sheets

CIRCUIT CONFIGURATION HAVING A FEEDBACK OPERATIONAL AMPLIFIER

BACKGROUND OF THE INVENTION

1. Area of the Invention

The present invention relates to a circuit configuration having a feedback operational amplifier for amplifying an input signal input into the circuit configuration and outputting the amplified input signal as an output signal.

Circuit configurations of this type are known in manifold forms. Solely for exemplary purposes, reference is made to the textbooks "U. Tietze, Ch. Schenk, Halbleiter-Schaltungstechnik [Semiconductor Circuit Technology], 5th Edition, Springer-Verlag, 1980", in particular pages 93 through 108, and "Paul Horwitz, Winfield Hill, The Art of Electronics, Second Edition, Cambridge University Press, 1989", in particular pages 175 through 195.

The term "operational amplifier" as defined in the present invention is to be understood very broadly as a configuration capable of amplifying an electrical variable such as a voltage. In particular, it refers to amplifiers, for example, in which a signal applied to the amplifier input is provided having relatively high voltage amplification at the amplifier output. This open amplification ("open loop gain") may be in the magnitude of approximately $10^4$ through $10^5$, for example.

An essential characteristic of the circuit configuration according to the species is that the circuit amplification, i.e., the ratio between output signal and input signal, is practically entirely independent of this open amplification (except for transient occurrences) and is solely predefined by an additional (external) configuration of the operational amplifier.

The term "feedback network" refers in the scope of the present invention to any such configuration of the operational amplifier which exerts an influence on the resulting circuit amplification. In the simplest case, the feedback network comprises a configuration of one or more (ohmic) resistors. Alternatively or additionally, other components such as capacitors and/or inductors may be provided to produce the feedback network. Very generally, these components provided to produce the feedback network are thus identified in the following as impedances.

2. Description of the Prior Art

There are applications in which a circuit configuration is required in which the circuit amplification is continuously changeable. In order to achieve this, essentially two approaches are followed in the prior art.

One possibility is to connect a damping element, whose damping is changeable, upstream of an amplifier having a fixed predefined amplification.

Another possibility is to implement amplification-determining resistors of the feedback network on an operational amplifier by MOS transistors, which are operated in the triode range. The effective resistance of these transistors may be changed continuously by a corresponding change of activation signals (gate source voltages).

Both achievements of the object are not satisfactory in all applications. In the first achievement of the object, nonlinearities typically occur in the damping element, for example, which have an effect on the circuit amplification.

In the second achievement of the object, above all, a disadvantage is the restricted linearity of the resistors implemented by MOS transistors in the triode range and, accompanying this, a reduced linearity of the circuit configuration.

OUTLINE OF THE INVENTION

It is the object of the present invention to provide a circuit configuration of the type cited at the beginning in which the circuit amplification may be continuously changed in a simple and reliable way.

This object is achieved according to the present invention in that the feedback network for changing the circuit amplification comprises multiple impedances which are alternately connectable and disconnectable via one transistor each, an integration element being connected upstream from each of the control inputs of the transistors.

In the present invention, the circuit amplification may be changed by alternately connecting or disconnecting impedances. The integration elements connected upstream from each of the control inputs of the transistors used for this purpose, e.g., the gates of field-effect transistors, ensure a certain temporal smoothing of the curve of the circuit amplification as an impedance is connected or disconnected. The integration element thus particularly ensures that even in the event of a sudden change of the affected activation signal, the affected impedance is not also suddenly disconnected or connected. This has a corresponding "evening" effect on the resulting circuit amplification.

There are manifold possibilities for implementing the integration element to achieve the effect explained above.

In an especially simple and preferred embodiment, the integration element is implemented as an integrator. This is to mean that this element provides a signal at its output which represents the temporal integral of the signal supplied at the input, this integrator output signal being delimited by the output signal range provided for the integrator, of course.

A common concept for implementing an integrator which is usable here, for example, is to use a voltage-controlled current source for charging and discharging a permanently predefined capacitor and to use the voltage applied to this capacitor as the integrator output signal.

In an especially simple embodiment, the integration elements each have a permanently predefined integration or smoothing characteristic. For example, if implemented as integrators, a permanently predefined integration time constant may be provided. The integration characteristic may be tailored in particular to the change speeds of the circuit amplification to be expected in practice (e.g., changeover frequency in digital switching signals). Thus, especially efficient evening of the continuous amplification change may be achieved in practical application. However, it is not to be precluded that the individual integration elements may be different from one another or may be provided with a changeable integration characteristic.

In a preferred embodiment, the integration elements are impinged with digital switching signals (switching signals which are always switched to one of multiple (e.g., two) discrete signal values). This makes the circuit configuration of interest especially in "digital environments" in particular, e.g., in a "mixed-signal chip" in particular. Such activation signals which may be changed over more or less suddenly may be generated by a digital data processing unit such as a microcontroller, for example. In the scope of the present invention, the switching signals are then supplied "in smoothed form" to the control inputs of the switching transistors, so that in spite of discrete (digital) amplification adjustments, abrupt changes of the circuit amplification do not result, which would act as sampling effects in the output signal spectrum of the circuit configuration, for example.

In a preferred embodiment, the desired circuit amplification is coded by the status of multiple digital switching signals, a single-step code being used, so that upon transition from one code word to the next following code word, only one activation signal state always changes. For this purpose, for example, for a monotone change of the circuit amplification, switching signals applied to the integration elements are changed over in sequence (one after another).

In one embodiment, the operational amplifier is incorporated as an inverting amplifier in the circuit configuration. In an operational amplifier having an inverting amplifier input terminal and a noninverting amplifier input terminal, for example, a circuit input terminal may be connected to the inverting amplifier input terminal. This connection of the circuit input terminal to the amplifier input terminal may be implemented directly or indirectly. In the latter case, for example, the circuit input terminal may be connected via a coupling path to the inverting amplifier input terminal, the coupling path forming a part of the feedback network.

Such a coupling path may comprise multiple coupling branches connected in parallel to one another, for example, each of which comprises a series circuit made of one of the transistors and one of the impedances. In this case, the number of coupling branches which are effective in the feedback network may be changed alternately using the switching transistors. In a simple embodiment, the individual coupling branches are implemented identically to one another, i.e., for example, are each formed by a series circuit of a transistor and an ohmic resistor of predefined uniform resistance value. However, this is in no way required. In a preferred embodiment, however, the impedances provided by the individual impedance branches are "identical" i.e., for example, uniformly represent only resistive or only capacitive or complex impedance values which are identical to one another or differ from one another solely through a scaling factor.

In one embodiment, an amplifier output terminal is connected via a feedback path to an inverting amplifier input terminal, the feedback path forming a part of the feedback network.

Such a feedback path may have one or more special features described above with reference to the coupling path.

Thus, in one embodiment, the feedback path comprises multiple feedback branches connected in parallel to one another, each of which comprises a series circuit made of one of the transistors and one of the impedances.

In one embodiment, the connectable and disconnectable impedances are provided in a coupling path between the circuit input and the amplifier input and also in a feedback path between the amplifier output and amplifier input.

In a refinement of this embodiment, at least one integration element provided for the coupling path is coupled to at least one integration element provided for the feedback path in such a way that connecting the affected impedance into the coupling path is connected to disconnecting the affected impedance in the feedback path and vice versa. In many cases, the performance properties of the circuit configuration, in particular its linearity properties, for example, may thus be improved further.

The circuit configuration according to the present invention may advantageously implement a functional block in a microelectronic integrated circuit, for example, in particular in a "mixed-signal chip". The transistors provided for the external configuration of the operational amplifier (and also transistors provided in the operational amplifier) may advantageously be implemented as field-effect transistors, for example (e.g., in CMOS technology).

A use of the circuit configuration described which is preferred in the scope of the present invention comprises signal conditioning in a measuring method. An especially interesting use exists for measuring methods in which the signals to be measured are based on reception signals whose amplitude changes over time because of the system, for example. These include, for example, ultrasonic and radar applications in which the reception signal is damped in accordance with the signal propagation distance.

BRIEF DESCRIPTION OF THE DRAWING

The present invention is described further in the following on the basis of exemplary embodiments with reference to the attached drawing.

DESCRIPTION OF THE PREFERRED EMBODIMENTS

Figure 1:
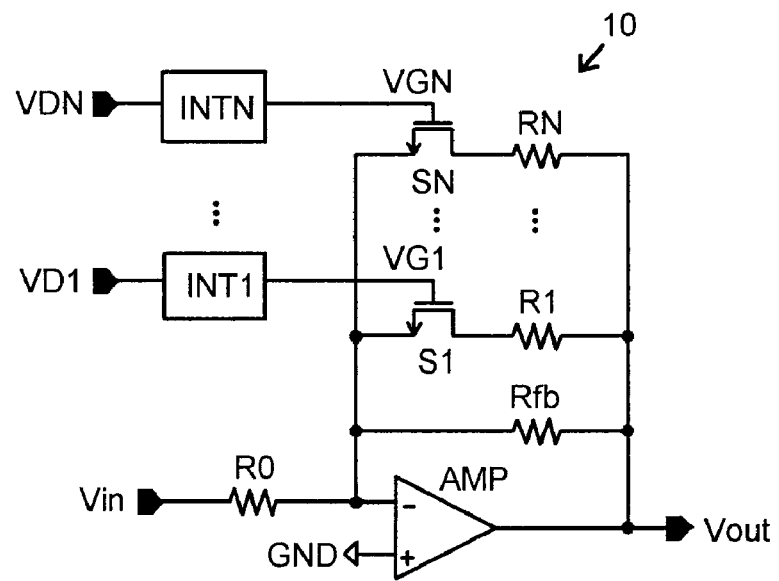
FIG. 1 shows a circuit configuration for continuous amplification change in an inverting amplifier.
Figure 1:
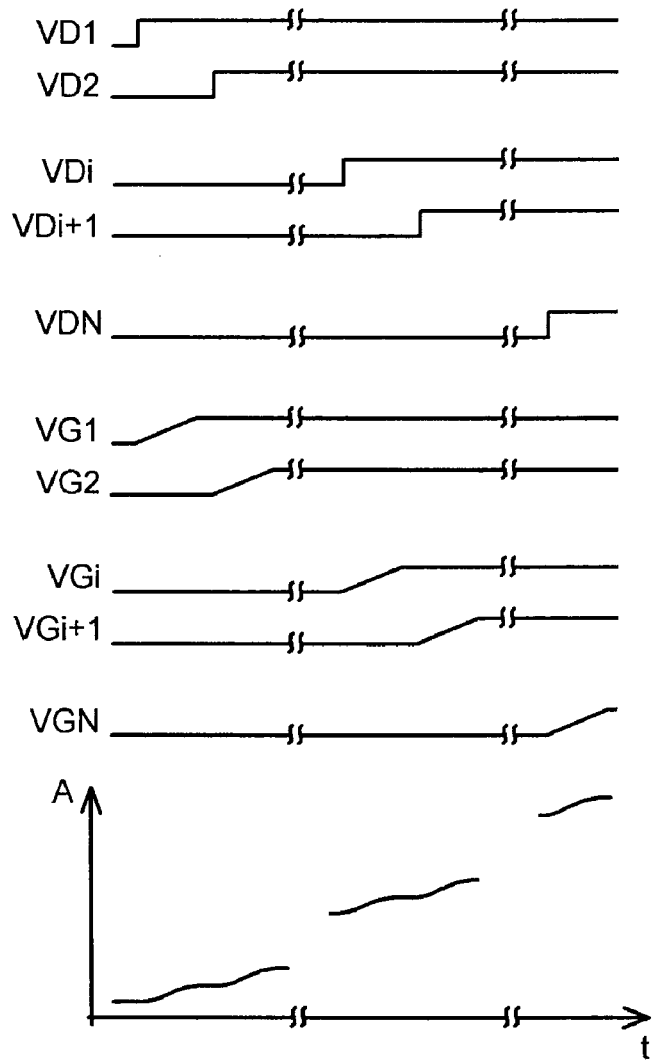

On the top, FIG. 1 shows a circuit configuration identified overall by 10 having a circuit input for an input signal Vin to be amplified and a circuit output to output the amplified input signal as an output signal Vout.

The circuit configuration 10 comprises an operational amplifier AMP, whose amplifier input is impinged in the way shown with the input signal Vin and at whose amplifier output the amplified input signal is provided, the operational amplifier being fed back using a feedback network to define the circuit amplification (=Vout/Vin).

In way known per se, the feedback network comprises a resistive coupling path (resistor R0) running from a circuit input terminal to an inverting amplifier input terminal, and a feedback path running from an amplifier output terminal to the inverting amplifier input terminal, which is formed by a parallel circuit of multiple resistors Rfb, R1, . . . , RN.

The special feature of the circuit configuration 10 is that to change the circuit amplification defined by the feedback network, the resistors R1, . . . RN are selectively connectable and disconnectable to the feedback network via one assigned transistor S1, . . . SN each, the corresponding digital switching signals VD1, . . . VDN not being supplied directly to the gates of the transistors, which are each implemented here as field-effect transistors, but rather via interposed integration elements INT1, . . . INTN. The individual series circuits, which are each made of a resistor (Ri (i=1 . . . N) and a transistor Si (i=1 . . . N), thus form feedback branches, which may be connected and disconnected selectively to and from the feedback network through a corresponding changeover of the activation signals VD1 , . . . VDN.

In the feedback network shown, an overall conductivity of the feedback path results as the sum of the conductivity of the feedback branch Rfb which is always provided and the conductivities of the currently connected feedback branches R1, . . . RN.

For a monotone change of the circuit amplification, in the exemplary embodiment shown, a sequential changeover of the digital switching signals of VD1 . . . VDN is provided. Even if the individual activation signals suddenly change their state at specific times, this does not at all result in a corresponding abrupt change of the overall impedance in the feedback path and thus in a corresponding abrupt change of the circuit amplification, since the individual switching transistors S1, ... SN are not activated directly, but rather via the integration elements INT1, ... INTN.

This advantageous evening of the amplification change is illustrated in the bottom part of FIG. 1. Curves of various variables as a function of the time t are shown there.

For this purpose, it is assumed that a specific switching signal VDi (i=1 ... N) changes its state at a specific time. A further switching signal VDi+1 also changes its state following this. At the outputs of the assigned integrators, the signal curves identified by VGi and VGi+1 then result. The circuit amplification A does not change abruptly in steps but rather only gradually due to the "soft" connection (or disconnection) of the affected feedback branches.

Notwithstanding the exemplary embodiment shown, the transmission function of the integration elements INT1, ... INTN may also be selected (or tailored to the characteristic of the switching transistors) so that during the sequential changeover of the activation signals VG1, ... VGN, an essentially linear change of the circuit amplification A occurs.

In the exemplary embodiment shown a "single-ended" configuration of the circuit configuration 10 is selected, in which the signals Vin and Vout provided as voltages are each in relation to a shared potential (ground potential GND). Notwithstanding the example shown, the circuit configuration may also be configured differentially.

Figure 2:
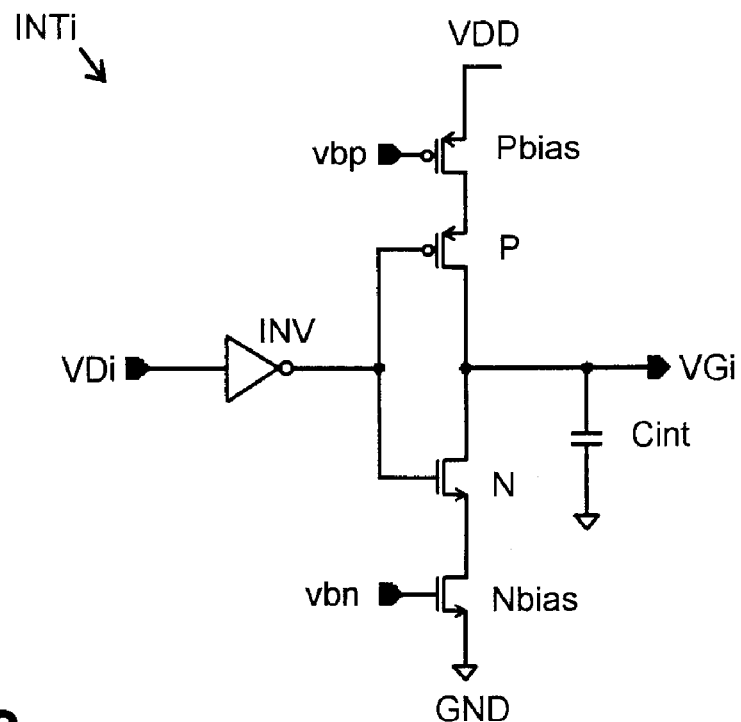
FIG. 2 illustrates an implementation of an integrator which is usable in the circuit configuration from FIG. 1.

FIG. 2 shows the circuit diagram of an integrator INTi, as may be used, for example, to implement the integrators INT1, ... INTN illustrated in FIG. 1.

As shown, the integrator INTi comprises a series circuit made of transistors Pbias, P, N, Nbias, which is situated between a positive supply potential VDD and the ground potential GND. The digital switching signal VDi is input to an inverter INV in the exemplary embodiment shown. The output signal of this inverter INV is supplied as the activation signal to the control inputs of the transistors P, N of different line types (alternatively, the switching signal VDi may also be conducted directly—without the inverter—to its control inputs). Depending on the (binary) state of the switching signal VDi, only one of the two switching transistors P, N always conducts, so that a capacitance Cint situated between a middle tap of these transistors and the ground potential GND is either charged via the transistor P or discharged via the transistor N. The charging procedure and the discharging procedure end as soon as the voltage applied to the capacitor corresponds to the positive supply potential VDD or the ground potential GND. The speed at which the capacitor Cint is charged and discharged is predefined in this case by the transistors Pbias, Nbias used as current adjustment transistors. This current preset is performed by impinging the control inputs of these transistors Pbias, Nbias with corresponding adjustment potentials vbp and vbn. These adjustment potentials vbp, vbn may have a constant value, for example, the transistors being operated essentially as constant current sources in the saturation range.

The smoothing effect of the upstream integrators INT1, ... INTN is essential for the function of the circuit configuration 10 (FIG. 1), which may be achieved especially easily using the integrator configuration INTi shown in FIG. 2. Notwithstanding this example, upstream integration elements may also be implemented differently. Notwithstanding the exemplary embodiment shown, it is also possible to provide a non-inverting amplifier configuration.

In the following description of a further exemplary embodiment of a circuit configuration, identical reference signs are used for identical components. Essentially only the differences to the exemplary embodiment already described above are described and otherwise reference is hereby expressly made to the preceding description.

Figure 3:
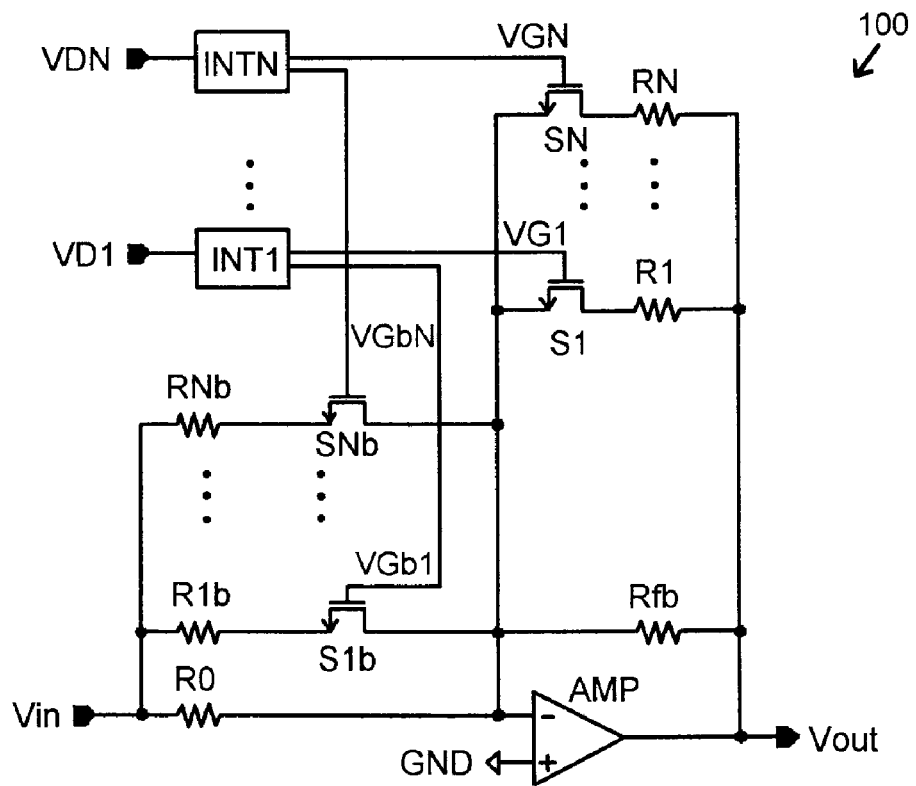
FIG. 3 shows a circuit configuration according to a further embodiment, in which an activation-side coupling between a coupling path and a feedback path is provided.

FIG. 3 shows a circuit configuration identified overall by 100, which is modified in two ways in relation to the circuit configuration already described with reference to FIG. 1.

A first difference is that the feedback network of the circuit configuration 100 also has a parallel configuration of coupling branches, each of which is produced as a series circuit made of a switching transistor S1b, ... SNb and an impedance in the form of a resistor R1b, ... RNb, similar to the parallel configuration of feedback branches. This has the result that the impedance effective both in the feedback path and also in the coupling path may be changed through corresponding activation signals, which may often be exploited in practice to improve the performance properties of the overall configuration.

A further modification is that individual feedback branches are each coupled to one of the coupling branches in such a way that branches assembled in pairs are always activated or deactivated simultaneously in the opposite manner. In the example shown, this functional coupling is implemented by integrators INT1, ... INTN, each of which has two outputs and thus activates the switching transistors of the assigned branches simultaneously. This coupling is provided in such a way that a connection of the affected resistor R1, ... RN in the feedback path is always accompanied by a disconnection of the affected resistor R1b, ... RNb in the coupling path and vice versa.

Figure 4:
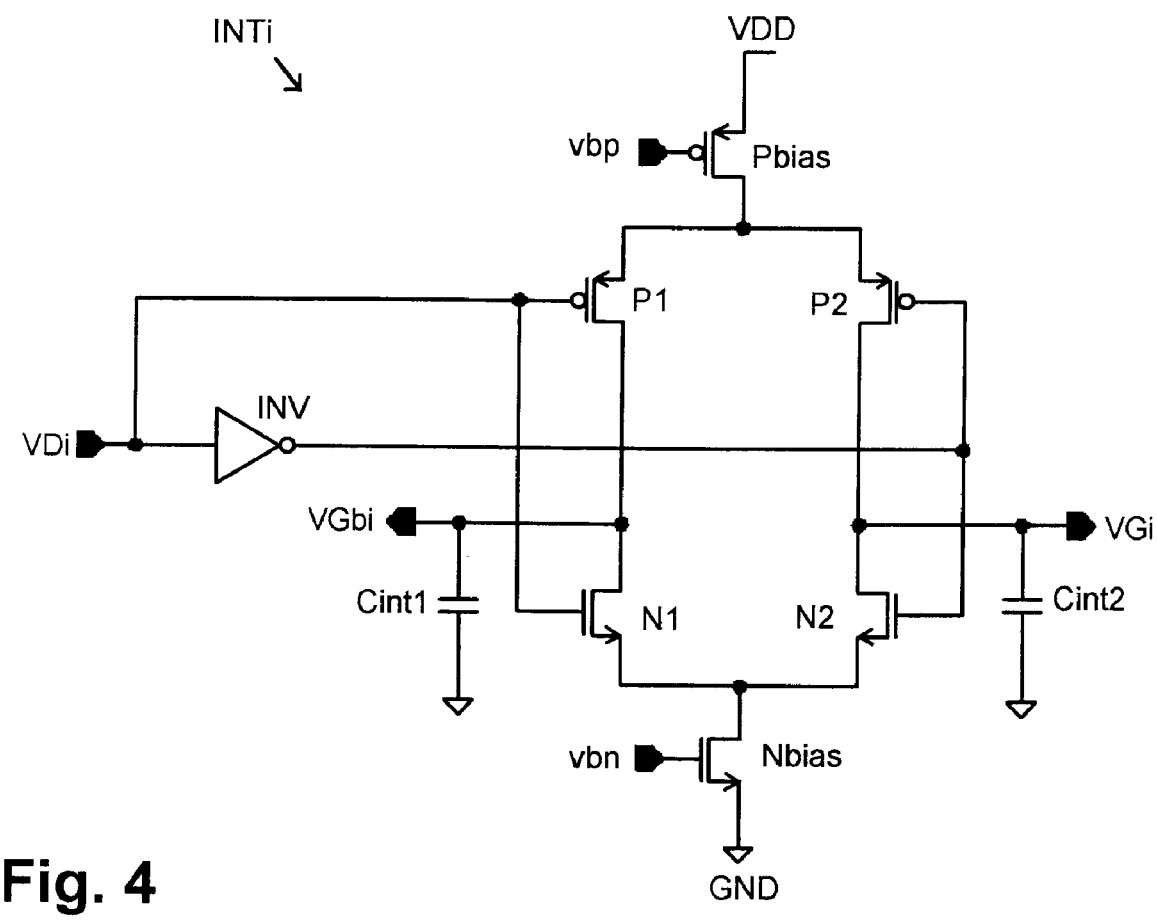
FIG. 4 illustrates an implementation of an integrator which is usable for the circuit configuration from FIG. 3.

FIG. 4 shows the construction of an integrator INTi suitable for this purpose, in which a binary switching signal VDi is supplied both inverted to the control inputs of switching transistors P2, N2 and also not inverted to the control inputs of additionally provided transistors P1, N1. The series circuits P2, N2 and P1, N1 are situated parallel to one another for this purpose and are connected via a current setting transistor Pbias to VDD and via a current setting transistor Nbias to the ground potential GND. Middle taps of the series circuits P2, N2 and P1, N1 lead to first terminals of particular capacitors Cint2 and Cint1, respectively, whose second terminals are connected to the ground potential GND. The overall construction thus essentially corresponds to a double embodiment of the integrator shown in FIG. 2, complementary output signals VGi and VGbi being generated on the basis of the input switching signal VDi. The former signals thus ensure the simultaneous, but complementary activation of the two transistors Si, Sib (i=1 ... N) connected to the integrator.

In both embodiments of the circuit configuration described above, in the event of a constant switching signal, the assigned switching transistor (at latest after a specific delay predefined by the integration element) either essentially conducts or essentially blocks, so that no noticeable losses occur at the transistors in this stationary state. The changeover of the transistor states is performed through corresponding variation of gate-source voltages, which are provided at the output of the integration elements. A sudden change of these activation voltages is thus avoided. Since every switching transistor finally remains completely turned on or turned off after passing through the state change, the overall amplifier configuration thus has linearity properties which are essentially independent of the properties of the transistors and are thus especially good. The impedances of the transistors themselves may accordingly be negligible in practice in relation to the impedances which are thus activated and deactivated. Instead of the NMOS switches shown in the examples, for example, PMOS switches or a combination thereof may also be used.

The invention claimed is:

1. A circuit configuration having a circuit input for an input signal (Vin) to be amplified and a circuit output to output the amplified input signal as an output signal (Vout), the circuit configuration comprising an operational amplifier (AMP), whose amplifier input is impinged by the input signal (Vin) to be amplified and at whose amplifier output the amplified input signal (Vout) is provided, the operational amplifier (AMP) being fed back using a feedback network to define the circuit amplification, characterized in that the feedback network comprises multiple impedances (R1, ... RN; R1b, ... RNb), which are each selectively connectable and disconnectable via a switching transistor controlled by a digitally generated switching signal, to change the circuit amplification (A) in accordance to the digital states of the switching signals, an integration element (INT1-INTN) for smoothing the switching signal being connected upstream from the control inputs of each of the transistors.

2. The circuit configuration according to claim 1, wherein the integration element (INT1-INTN) is implemented as an integrator.

3. The circuit configuration according to claim 1, wherein the switching signals (VD1-VDN) are generated by a digital data processing unit.

4. The circuit configuration according to claim 1, wherein the switching signals (VD1-VDN) supplied to the integration elements (INT1-INTN) are changed over in sequence for a monotone change of the circuit amplification (A).

5. The circuit configuration according to claim 1, wherein a circuit input terminal is connected to an inverting amplifier input terminal.

6. The circuit configuration according to claim 5, wherein the circuit input terminal is connected via a coupling path to the inverting amplifier input terminal, the coupling path forming a part of the feedback network.

7. The circuit configuration according to claim 6, wherein the coupling path comprises multiple coupling branches connected to one another in parallel, each of which comprises a series circuit made of one of the transistors and one of the impedances (R1b, ... RNb).

8. The circuit configuration according to claim 1, wherein an amplifier output terminal is connected via a feedback path to an inverting amplifier input terminal, the feedback path forming a part of the feedback network.

9. The circuit configuration according to claim 8, wherein the feedback path comprises multiple feedback branches connected to one another in parallel, each of which comprises a series circuit made of one of the transistors and one of the impedances (R1, ... RN).

10. The circuit configuration according to claim 1, wherein the connectable and disconnectable impedances (R1, ... RN; R1b, ... RNb) are provided both in a coupling path between the circuit input and the amplifier input and also in a feedback path between the amplifier output and the amplifier input.

11. The circuit configuration according to claim 10, wherein at least one integration element (INT1-INTN) provided for the coupling path is coupled to at least one integration element (INT1-INTN) provided for the feedback path in such a way that a connection of the affected impedance (R1b, ... RNb) in the coupling path is connected to a disconnection the affected impedance (R1, ... RN) in the feedback path and vice versa.

* * * * *